United States Patent [19]

Op de Beek et al.

[11] Patent Number: 4,677,389
[45] Date of Patent: Jun. 30, 1987

[54] NOISE-DEPENDENT VOLUME CONTROL HAVING A REDUCED SENSITIVITY TO SPEECH SIGNALS

[75] Inventors: Franciscus J. Op de Beek; Johannes W. Kemna, both of Eindhoven, Netherlands

[73] Assignee: U.S. Philips Corporation, New York, N.Y.

[21] Appl. No.: 789,998

[22] Filed: Oct. 22, 1985

[30] Foreign Application Priority Data

Oct. 22, 1984 [NL] Netherlands .................... 8403200

[51] Int. Cl.$^4$ .............................................. H03G 3/20
[52] U.S. Cl. .................................. 330/129; 330/136; 330/149; 330/279; 381/120; 455/238
[58] Field of Search ............... 330/129, 136, 149, 279; 455/238; 381/86, 94, 95, 107, 108, 109, 120

[56] References Cited

PUBLICATIONS

Hoisington et al., "Automatic Control of Speaker Output Compensates for Noisy Background", *Electronics*, Nov. 20, 1972, pp. 118–121.

*Primary Examiner*—James B. Mullins
*Attorney, Agent, or Firm*—Thomas A. Briody; Jack Oisher; William J. Streeter

[57] ABSTRACT

The noise-dependent volume control in accordance with the invention is capable of distinguishing between the real background noise and speech in a space (8). The gain (A) of the amplifier (1) is corrected only depending on the level of the background noise, so that once a difference in level between the background noise and a desired signal has been set this is maintained. The volume control is based on repeated measurements of the acoustic signal in the space (8). If it appears that in at least one frequency range the measured energy content ($E_i$) has fallen at least N times within a range of values $\Delta M$ around a value ($M_i$) stored in a memory (26) the gain factor is adapted.

26 Claims, 8 Drawing Figures

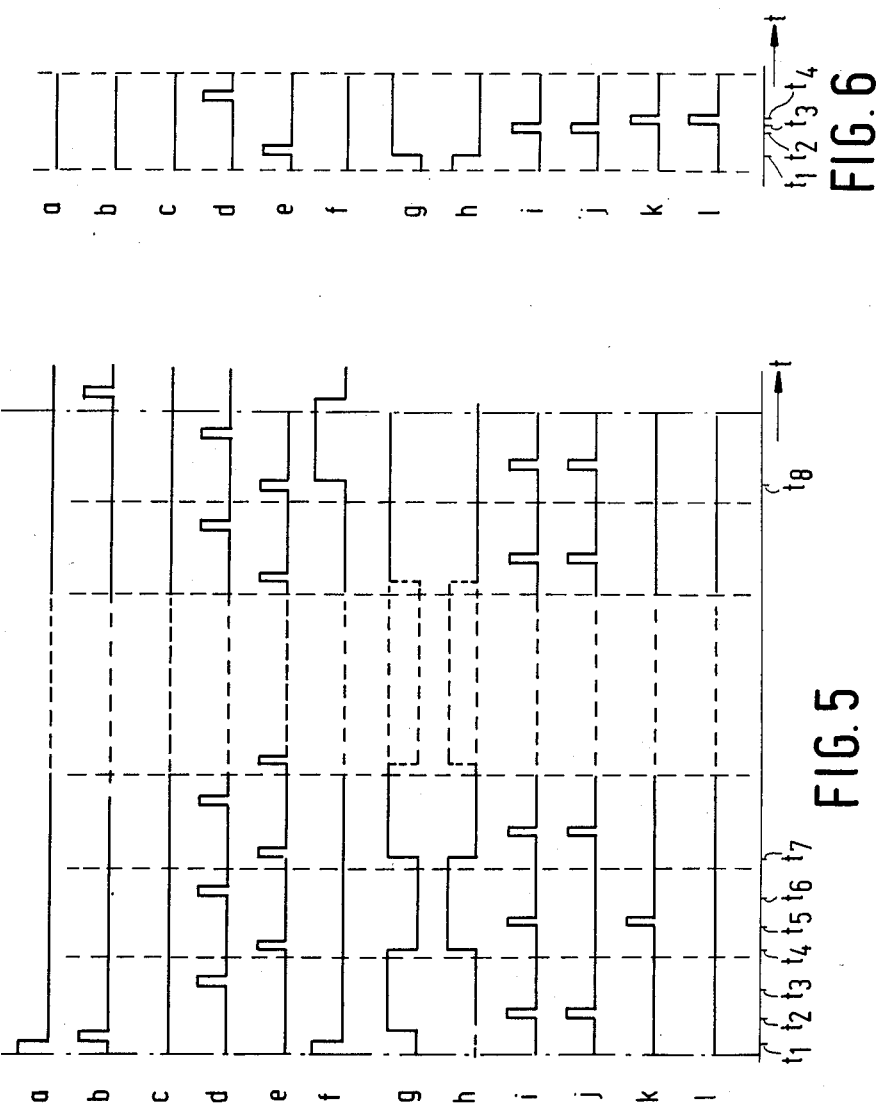

NOISE-DEPENDENT VOLUME CONTROL HAVING A REDUCED SENSITIVITY TO SPEECH SIGNALS

FIELD OF THE INVENTION

The invention relates to a method of adapting the gain of an amplifier to the level of the background noise produced in a space by an independent sound source (if present), in which a signal which is representative of the acoustic signal in the space is detected by detection means and is converted into an electric signal, after which a control signal which is a measure of the background-noise level is derived; depending on which control signal the gain of the amplifier is adapted, in such a way that the gain is increased in the case of an increase of the background-noise level and reduced in the case of a reduction of the background-noise level. The invention also relates to a device for carrying out the method and a device for deriving a control signal from an electric signal for use in the method. Such a method and device are known from German Offenlegungsschrift No. 27 31 971. The known method and device have the disadvantage of not always perform satisfactorily, resulting in too high a gain setting, so that the desired acoustic signal in the space becomes too strong and therefore annoying.

BACKGROUND AND SUMMARY OF THE INVENTION

The invention aims at providing an improved method and device, in such a way that the gain setting of the amplifier is more in conformity with the background noise in the space thereby obtaining a more pleasant level of the desired acoustic signal in the space.

To this end a method in accordance with the invention is characterized in that, for a specific gain setting of the amplifier and specific contents of at least one memory corresponding to an associated frequency range, the following set of steps is carried out in each of successive operations:

(a) a sample comprising a portion of the electric signal which lies within a specific time interval is taken, (b) a quantity is derived from said sample of the electric signal for said frequency range, which quantity is a measure of the energy content of said portion in the frequency range, (c) the quantity corresponding to the energy content in the freqeuncy range is compared with the value of the contents of the memory, (d) if it is found in step (c) that the value obtained for the quantity in step (b) lies within a range of values around the value stored in the memory, the count of a counter which corresponds to the frequency range is incremented by a first number and subsequently the count of this counter is compared with a first final value, (e) if it is found in step (c) that the value obtained for the quantity in step (b) lies outside the range of values around the values stored in the memory or if it is found in step (d) that the count of the counter has reached the first final value, the count of the counter is decremented, preferably set to a first initial value, the operation is repeated from step (a) for a new sample comprising a portion of the electric signal which lies within a specific time interval and, if during an operation it is found for the frequency range that the count of the counter has reached the first final value, the gain of the amplifier is adapted (if necessary). If the counter is set to the first initial value in step (e), it is clear that the said counter indicates the length of the sucession of immediately preceding operations for which the quantity lay within the range around the value stored in the memory.

The invention is based on the recognition of the fact that the methods and devices known until now are not capable of distinguishing between background noise and speech.

To illustrate for know methods and devices, if two persons in the space (for example, the passenger compartment of a car) in which a radio employing said known method or equipped with said known device is present and is switched on, begin a conversation, the method or the device will interpret the speech as background noise, which causes the gain of the amplifier to be increased.

Consequently, the persons will start talking louder, which results in a further increase of the amplifier gain. The persons again begin to talk louder, so that the gain is increased again . . . etc. This results in.

(a) a gain which is far too high in comparison with the "true" background noise, i.e. the acoustic signal in the space minus the desired signal delivered by the amplifier and minus the speech, (b) a gain which is much too high in comparison with the speech level.

This is very annoying. Therefore, a system is required which responds to the "real" background noise and which does not respond to an undue extent to speech signals. This can be achieved by means of the inventive method. Use is made of knowledge that:

(i) viewed in time, speech signals fluctuate rapidly in amplitude, whilst the "real" background noise is of fairly constant amplitude;

(ii) viewed in time, the frequency of speech changes rapidly and the frequency (band) of the "real" background noise changes hardly or not at all (or in any case very slowly);

(iii) speech signals exhibit pauses (to build up explosions during the pronunciation of some sounds, for example the letter "p"), whilst the "real" background noise generally exhibits no breaks.

These three points impose special requirements on the method and the device. The step in accordance with the invention in which repeatedly measurements are made in (at least) one frequency range and in which it is detected whether the energy content in the frequency range varies is based on the aforementioned point (i).

It is evident that, if measurements in only one frequency range are made, this frequency range should contain the principal frequency components of the background noise.

An improved method in accordance with the invention may be characterized in that, for a specific setting of the gain of the amplifier and specific contents of n memories each of which corresponds to a respective one of n frequency ranges ($n \geq 2$), the following set of steps is carried out in each of successive operations:

(a) a sample comprising a portion of the electric signal which lies within a specific time interval is taken, (b) a quantity is derived from this sample of the electric signal for a frequency range i, which quantity is a measure of the energy content of said portion in the relevant frequency range, (c) the $i^{th}$ quantity corresponding to the energy content in the $i^{th}$ frequency range is compared with the value of the contents of the $i^{th}$ memory of the n memories each of which corresponds, to a respective frequency range, (d) if it is found in step (c) that the value for the $i^{th}$ quantity obtained in step (b) lies within a range of values around the value stored in the $i^{th}$ memory, the count of one of n counters each of which corresponds to an associated frequency range, is incremented by a first number, and, subsequently, the count of this counter is compared with a first final value, (e) if in step (c) the value for the $i^{th}$ quantity obtained in step (b) is found to lie outside the range of values around the value stored in the $i^{th}$ memory or if in step (d) the count of the counter is found to have reached the first final value, the count of the counter corresponding to the $i^{th}$ frequency range is decremented and preferably set to a first initial value, (f) if it is found in step (d) that the count of the counter has not yet reached the first final value or if step (e) is carried out, the value i is incremented by a second number and compared with a second final value, (g) if it is found in step (f) that the value i has not yet reached the second final value, the method is continued from at least step (c) for another frequency range, (h) if it is found in step (f) that the value i has reached the second final value, the operation is repeated from step (a) for a new sample comprising a portion of the electric signal which lies within a specific time interval, the value for i being set to a second initial value before step (c) is carried out again, and if during an operation the count of the associated counter is found to have reached the first final value for at least one frequency range i, the gain of the amplifier is adapted (if necessary). In this case it is clear that, if the counters are set to the first initial value(s) in step (e), the said counters each indicates the number of immediately preceding operations in which for the corresponding frequency range i, the value obtained for the quantity lay within the range around the value stored in the $i^{th}$ memory. This method in addition utilizes the aspect given in point (ii).

Hereinafter, a version for two or more frequency ranges will be described in more detail. However, it is obvious that steps relating to one frequency range may also be employed in a method in which measurements in only one frequency range are made. The frequency ranges should be selected in such a way that, for an optimum control in response to the "real" background noise level, they together cover a frequency range within which the "real" background noise lies at least for the greater part. Moreover, each frequency range should have only a part of the frequency range within which the speech lies in common with this frequency range.

If only speech signals are received in the frequency ranges, the signal content in the frequency ranges will vary rapidly as a function of time. However, if only the "real" background noise is detected, the signal content in one or more frequency ranges will remain substantially constant as a function of time. Thus, if in a plurality of successive operations in a frequency range i (and of course in parallel for the other frequency ranges) the $i^{th}$ quantity) generally referred to as "signal content" in order to indicate that at option, for example the energy content, the average amplitude or the RMS value may be determined it is possible to make a distinction between "real" background noise and "real background noise with superimposed speech". In the former case the gain of the amplifier may be adapted. In the latter case the gain should not be adapted.

This "distinction" is made as follows: if in a number of successive operations, which number corresponds to the first final value, it is found that the value for the $i^{th}$ quantity always lies within the range of values around the value stored in the $i^{th}$ memory (i.e. there is "real" background noise), the gain of the amplifier is adapted (if necessary). The level of the "real" background noise may not have changed since the last adaptation of the gain. Then, it is not necessary to adapt the gain. Of course, the gain may be nominally adapted. However, the gain is then maintained at the same value.

The control signal may not be only used for adapting the gain but also for adapting, for example, the dynamic range of the signal to be amplified. For example, the dynamic range may be reduced or extended when the background-noise level increases and decreases, respectively.

In those cases in which, before the first final value is reached, the value for the $i^{th}$ quantity lies outside the range of values around the value stored in the $i^{th}$ memory, the count of the counter corresponding to the $i^{th}$ frequency range is decremented and is preferably set to the first initial value. Consequently, the amplifier gain is not adapted. In this case there is apparently "real background noise with superimposed speech".

The gain may be adapted every time in step (d) immediately after it has been found that for a specific frequency range in this step i the count of the $i^{th}$ counter has reached the first final value. It is alternatively possible not to adapt the gain until the end of an operation for all those frequency ranges (at least one!) for which during the operation the count of the associated counter(s) is (are) found to have reached the first final value.

The first final value has a lower limit which is determined by the maximum duration of a speech utterance and the measurement time of an operation. The maximum duration of a speech utterance is approximately 250 ms and the measurement time of an operation depends inter alia on the delay times in the components used. The first final value should then be larger than or equal to 250 ms divided by the measurement time of an operation. The measurement accuracy increases as the first final value increases, but this leads to an increased response time of the system.

If the gain of the amplifier has the same value for the entire frequency range of the audio signals, the gain for the entire frequency range will be adapted even if the first final value is reached in only a single frequency range i. This means that acoustic and/or system-engineering steps are applied to enable the gain for the entire frequency range to be adapted although the first final value is reached only for a limited number of frequency ranges.

In accordance with the invention the method of adapting the frequency-dependent gain of the amplifier in said n frequency ranges is characterized in that if during an operation it is found for at least one frequency range that the count of the associated counter has reached the first final value, the gain of the amplifier in the $i^{th}$ frequency range is adapted (if necessary). This "one to one" relationship between the quantities corresponding to the energy content in the n frequency ranges and the gain of the amplifier in these n frequency ranges therefore enables the gain in the associated frequency range to be adapted (if necessary) every time that the first final value is reached for a frequency range.

However, other variants are also possible, for example those in which the gain of the amplifier can be adapted in m frequency ranges (m<n). Now there is a relationship between the n frequency ranges in which measurements are made (and which have been combined to form m groups of frequency ranges, each group being related to one of the aforementioned m frequency ranges) and the m frequency range in which the gain is controlled.

A first embodiment of the method may be characterized in that, if it is found in step (c) that the value obtained for the $i^{th}$ quantity in ste (b) lies outside the range of values around the value stored in the $i^{th}$ memory, a new value for the $i^{th}$ quantity is derived in step (c) and is stored in the $i^{th}$ memory, starting from the value for the $i^{th}$ quantity obtained in step (b) and, as the case may be, the value of the contents of the $i^{th}$ memory. As the value for the $i^{th}$ quantity lies outside the range of values around the value stored in the $i^{th}$ memory, the conclusion must be drawn that there is either a varying background level or that the measurement of the background level has been disturbed by the presence of speech signals. These two possibilities cannot readily be distinguished from one another. Nevertheless, in the case of the first-mentioned possibility the value stored in the $i^{th}$ memory should be adapted to the new level measured. This may be achieved by storing the value for the $i^{th}$ quantity obtained in step (b) in the $i^{th}$ memory. In order to reduce both the influence of the presence of speech signals (the last-mentioned possibility) and the influence of extreme variations in background level, it is preferred to derive a new value for the $i^{th}$ quantity from the value of the $i^{th}$ quantity obtained in step (b) and the value of the contents of the $i^{th}$ memory (for example by taking the average of the two) and to store this value as the new vaue in the $i^{th}$ memory. In principle, the value stored in the $i^{th}$ memory need not be changed if the value of the $i^{th}$ quantity lies within the range of values around the value stored in the $i^{th}$ memory.

A second embodiment of the method may be characterized in that the step (c), starting from the value for the $i^{th}$ quantity obtained in step (b) and/or the value of the contents of the $i^{th}$ memory, also a new value for the $i^{th}$ quantity is derived and is stored in the $i^{th}$ memory. In this case, also if the value of the $i^{th}$ quantity lies within the range of values around the value stored in the $i^{th}$ memory, a new value for the $i^{th}$ quantity may be derived from the original value for the $i^{th}$ quantity and the value stored in the $i^{th}$ memory, which new value is stored in the $i^{th}$ memory. In this way it can be achieved that an as accurate as possible average background level is obtained.

A method in accordance with the invention may be characterized further in that in step (b) for all frequency ranges the associated quantities are derived and, if in step (f) it is found that the value i has not reached the second final value, the method proceeds from step (c). In one operation in accordance with this method a signal sample is taken only once and the corresponding quantities for all the n frequency ranges are determined at one time. This may be achieved, for example, in that a filter bank comprising n band-pass filters corresponding to the n frequency ranges is used and the output signals of these filters are measured at one time. Another possibility is to apply a Fourier transform (for example, a fast Fourier transform) to the signal sample taken in step (a) and to derive the quantities for the n frequency ranges from the result thereof.

Instead of this, the inventive method may be further characterized in that in step (b) said quantity is derived for only one frequency range i and, if it is found in step (f) that the value i has not yet reached the second final value, the method is continued from at least step (b) by determining the quantity which is a measure of the energy content of the relevant signal portion in another frequency range, and in step (h), if the operation is repeated from step (a), prior to step (b) being repeated, the value for i is set to a second initial value. In this case there are two possibilities of carrying out the method. In the case of the first possibility step (a) is carried out only once in one operation, after which n cycles are performed in each of which the $i^{th}$ quantity is derived for only one frequency range in step (b). This possibility may be adopted if a memory is used in which the signal sample can be stored. The reason for thus carrying out the method may be that only one filter is available whose central frequency and bandwidth are adjustable to the central frequencies and bandwidth of the n frequency ranges. In the case of the second possibility n cycles are performed in one operation, step (a) being carried out and subsequently in step (b) the $i^{th}$ quantity being derived from the signal sample for a frequency range i obtained in step (a) in one cycle. In a following cycle step (a) is repeated and the quantity for the $(i+1)^{th}$ frequency range is derived. This possibility should be adopted if there is no memory for the storage of the signal sample.

The device for carrying out the method in accordance with the invention, comprising
an amplifier whose gain can be controlled depending on a control signal and having an input coupled to a first input terminal for receiving an electric signal to be amplified, an output coupled to an output terminal for supplying an output signal, and a control input for receiving the control signal,
a second input terminal for receiving an electric signal which is a measure of the acoustic signal in the space,
conversion means for deriving a control signal which is a measure of the background-noise level, having an output coupled to the control input of the amplifier,
correction means for at least substantially correcting for the influence of the signal which has been amplified by the amplifier on the control signal, is characterized in that the device further comprises
a first unit having an input coupled to the second input terminal, for deriving for a frequency range from a portion of the electric signal which lies within a specific time interval a quantity which is a measure of the energy content of said portion in the relevant frequency range,
a second unit having an input coupled to an output of the first unit and an output, which second unit comprises a memory corresponding to the frequency range, for storing a value which is a measure of the energy content of the electric signal in the frequency range, a first comparator having a first input and a second input coupled to the output of the first unit and the output of the second unit, respectively, for comparing the value for the quantity corresponding to the frequency range and derived in the first unit with the value of the contents of the memory of the second unit which corresponds to said frequency range, a third unit comprising a counter corresponding to the frequency range, a second comparator having a first input coupled to an output of the third unit and an input for the first final value, which second comparator is adapted to compare the count of the counter with the first final value, the first comparator has a first output and a second output for supplying an output signal if the value of the quantity determined in the first unit lies within and outside, respectively, a range of values around the value stored in the memory of the second unit, said first output and the second output are coupled to a count input and another input preferably a reset input, respectively, of the third unit, the output of the second comparator is coupled to the other input of the third unit and is also coupled to a control input of the conversion means, for supplying a control signal if it is found in the second comparator that the count of the counter in the third unit has reached the first final value.

If the device is for carrying out the method in which measurements are made in two or more frequency ranges, it may be characterized further in that the first unit is adapted to derive for a frequency range i, from the portion of the electric signal which lies within the time interval, the quantity which is a measure of the energy content of said portion in the relevant frequency range, the second unit comprises n memories each corresponding to a respective one of the n frequency ranges, each for storing a value which is a measure of the energy content of the electric signal in the associated frequency range, the first comparator is adapted to compare the value for the quantity corresponding to the $i^{th}$ frequency range and derived in the first unit with the value of the contents of the memory of the second unit corresponding to this frequency range, the third unit comprises n counters each corresponding to a respective one of the n frequency ranges, the second comparator is adapted to compare the count of the $i^{th}$ counter with the first final value, the first comparator is further adapted to supply respective output signals if the value of the quantity determined in the first unit and corresponding to the $i^{th}$ frequency range lies within or outside a range of values around the value stored in the $i^{th}$ memory of the second unit respectively, and the second comparator is further adapted to supply a control signal if it is found in the second comparator that the count of the $i^{th}$ counter in the third unit has reached the first final value.

As stated in the foregoing, if the value for the $i^{th}$ quantity lies outside the range of values around the value stored in the $i^{th}$ memory of the second unit, the content of the $i^{th}$ memory should be replaced by a new value derived from the value for the $i^{th}$ quantity and, as the case may be, the value of the contents of the $i^{th}$ memory. To this end the device may be further characterized in that the second output of the first comparator is coupled to a load input of the second unit for storing said new value, which appears on the input of the second unit.

In general, the values stored in the memories of the second unit are preferably adapted every time. Thus, this is also done if the value for the $i^{th}$ quantity lies within the range of values around the value stored in the $i^{th}$ memory of the second unit. The device in accordance with the invention may then be characterized in that the output of the first unit and the output of the second unit are coupled to a first input and a second input, respectively, of a signal combination unit, which has an output coupled to the input of the second unit, which signal combination unit is adapted to derive a signal from the signals on its two inputs and to produce the resulting signal on its output, and the second unit comprises a load input for receiving a control signal for the storage of the signal appearing on the input of the second unit in the associated memory i of the second unit.

The device may be characterized further in that it further comprises an address counter having an output coupled to an address input of the first to the third unit inclusive, and a clock pulse input which is coupled to an output of a clock-pulse generator.

The device may be characterized further in that the first unit for determining the quantity which is a measure of the energy content in a specific frequency range i comprises a bandpass filter having a bandwidth which at least substantially corresponds to the bandwidth of the frequency range, having an input coupled to the input of the first unit and an output coupled to an averager. For each of the n frequency ranges the first unit may comprise such a combination of a band-pass filter and an averager. Then, the corresponding n quantities for all the frequency ranges can be determined at one time.

By using only one band-pass filter with a variable central frequency and bandwidth and only one averager, n−1 bandpass filters and n−1 averagers may be dispensed with in comparison with the preceding version of the first unit. However, this implies that the n quantities can no longer be determined simultaneously but have to be determined one after the other. Moreover, this leads to a more complicated control system.

The choice of the integration time of the averager should be such that it is not so long that the explosive character of speech is averaged out.

The correction means may comprise a similar bandpass filter, a similar averager and a signal combination unit, an input and an output of the band-pass filter being coupled to the input of the amplifier and to an input of the averager, respectively, which averager has an output coupled to a first input of the signal combination unit, a second input of the signal combination unit being coupled to an output of the averager of the first unit. By adjusting the integrating times of the averagers in the first unit and the correction means to the prescribed values, it can be ensured that compensation is obtained for the propagation delay of the acoustic signals in the space. This enables a suitable correction to be achieved by subtracting the signal on one input of the signal combination unit from the signal on the other input of this unit, provided that the two signals are applied to the two inputs in the correct phase relationship.

It is evident that, if the first unit comprises only one filter whose central frequency and bandwidth are adjustable to the central frequencies and bandwidths of the n frequency ranges, and if the correction means are constructed in the same way, then the filters should operate in identical frequency ranges.

It is also obvious that the correction means may be constructed differently, for example as the correction means described in DE-OS Nos. 25 22 381, 2 414 143, 27, 31 971, 24 56 468, and EP No. 26 929.

The device may be characterized further in that a second controllable amplifier is arranged between the second input terminal of the device and the input of the first unit. This step may be necessary because the dynamic range of the background noise may sometimes be very large. By providing additional attenuation before the first unit a simpler and less accurate analog-to-digital converter may be used if the first unit comprises an analog-to-digital converter for digitizing the signal before it is processed further.

The conversion means may be characterized in that they comprise
- a fourth unit comprising n memories each corresponding to a respective one of the n frequency ranges, for storing n reference values each corresponding to the respective one of the n frequency ranges,
- a fifth unit which also comprises n memories each corresponding to a respective one of the n frequency ranges,
- a sixth unit having a first input and a second input coupled to an output of the fourth unit and to an output of the fifth unit, respectively, and having an output coupled to the output of the conversion means, which sixth unit is adapted to derive a control signal from the signals applied to its two inputs, the control input of the conversion means is coupled to a load input of the fifth unit, for storing the if applicable, new value for the $i^{th}$ quantity in the corresponding memory of the fifth unit if it is found in the second comparator that the count of the $i^{th}$ counter in the third unit has reached the first final value. The construction of the sixth unit depends on whether the amplifier has a gain which is variable and adjustable over the entire audio-frequency range or a gain factor which is adjustable and variable in a plurality of m (which may be equal to n) frequency ranges.

In the first mentioned case the sixth unit should convert the information for the n frequency ranges, which is stored in the fourth and the fifth unit, into a single control signal which controls the gain of the amplifier over the entire audio-frequency range. In this situation the input signal of the first unit is preferably first subjected to an A-weighting or another weighting operation. For more details about the term "A-weighting" reference is made to "Application of B & K Equipment to Acoustic noise measurements" a Bruël and Kjaer publication of June 1975, (reprint), see in particular Chapter 3.8, page 31 and Chapter 4.1, page 43.

This A-weighting can ensure that all frequency ranges contribute to the amplifier control signal to the correct extent.

In the second case (when m=n) the sixth unit converts the information for each of the n frequency ranges, which is stored in the fourth unit and the fifth unit, into a control signal for each of the n frequency ranges, by means of which control signals the gain of the amplifier in the n frequency ranges is corrected. If m is smaller than n, the information relating to m groups of the n frequency ranges from the fourth unit and the fifth unit is combined by the sixth unit to obtain m control signals.

In all the cases the output of the address counter is also coupled to an address input of the fourth unit and the fifth unit.

If the gain of the amplifier is variable and adjustable in n frequency ranges, the sixth unit may be adapted to derive n control signals for adjusting the gain of the amplifier in the n frequency ranges.

The contents of the memories of the fourth unit, being the n reference values each corresponding to a frequency range, may be obtained in an initialising process before the method is started. In this initialising process the gain of the amplifier is set manually (by means of the volume control). It is assumed that the operator adjusts the gain of the amplifier by means of the volume control so as to obtain a suitable level of the desired signal relative to the background noise. A quantity which is a measure of the gain of the amplifier corresponding to this suitable level is now stored in the fourth unit as a reference value. Controlling is then effected in such a way that, starting from this initial setting of the gain, the device adapts the gain in the case of a variation of the background-noise level in such a way that for an increased background level the difference in level (in dB) between the amplifier gain and the background level in the new situation is the same as in the original situation.

If the volume control is again adjusted by the operator (i.e.: if the operator sets the gain to another value relative to the prevailing noise level) the method may be re-started by applying the new reference values to the fourth unit.

A device for deriving a control signal from an electric signal for use in the method in accordance with the invention may be characterized in that it comprises:
- a second unit having an input and an output, which second unit comprises a memory which corresponds to the frequency range for storing a value which is a measure of the energy content of the electric signal in the frequency range,
- a first comparator having a first input and a second input and an output, which second input is coupled to the output of the second unit, for comparing the value for the quantity corresponding to the frequency range with the value of the contents of the memory of the second unit corresponding to this frequency range,
- a third unit comprising a counter corresponding to the frequency range,
- a second comparator having a first input coupled to an output of the third unit and an input for the first final value, which second comparator is adapted to compare the count of the counter with the first final value, the first comparator comprises a first output and a second output for supplying an output signal if the value of the quantity lies within and outside, respectively, a range of values around the value stored in the memory of the second unit which first and second outputs are coupled to a count input and to another input preferably a reset input, respectively, of the third unit, the output of the second comparator is coupled to the other input of the third unit and is also coupled to a control input of the conversion means, for supplying a control signal if it is found in the second comparator that the count of the counter in the third unit has reached the first final value.

If the device for deriving the control signal is for use in the method in which measurements in two or more frequency ranges are made, it may be characterized further in that the second unit comprises n memories each corresponding to a respective one of the n frequency ranges, each for storing a value which is a measure of the energy content of the electric signal in the associated frequency range, the first comparator is adapted to compare the value for the quantity corresponding to the $i^{th}$ frequency range with the value of the contents of the $i^{th}$ memory of the second unit, the third unit comprises n counters each corresponding to a respective one of the frequency ranges, the second comparator is adapted to compare the count of the $i^{th}$ counter with a first final value, the first comparator is further adapted to supply respective output signals if the value of the quantity corresponding to the $i^{th}$ frequency range lies within or outside the range of values around the value stored in the $i^{th}$ memory of the second unit respectively, and the second comparator is further adapted to supply a control signal if in the second comparator the count of the $i^{th}$ counter in the third unit is found to have reached the first final value, and the device further comprises an address counter having an output coupled to an address input of the second unit and the third unit.

This last-mentioned device may be characterized further in that a seventh unit is arranged between the output of the conversion means and the control input of the amplifier, which seventh unit is capable of storing the value of the control signal derived in the sixth unit and comprises a load input for receiving a control signal at least once during an operation if during this operation it is found that for at least one frequency range i the count of the counter i of the third unit has reached the first final value. In this way a non-recurrent adaptation of the gain can be obtained in one operation, for example at the end of each operation. This device may be characterized further in that the seventh unit is adapted to store n values corresponding to the n control signals for controlling the gain of the amplifier, and the seventh unit further comprises an address input coupled to the output of the address counter.

Parts of the devices in accordance with the invention may be integrated and incorporated in a microprocessor. Preferably, at least the second unit and the third unit, the first comparator and the second comparator, the conversion means, and the address counter form part of the microprocessor.

Embodiments of the invention will now be described in more detail, by way of example, with reference to the accompanying drawings. In the drawings:

BRIEF DESCRIPTION OF THE DRAWINGS

FIGS. 4, 5 and 6 show some signals appearing on a number of points in the device of FIG. 3 as a function of time.

FIG. 1 relates to a method in which a number of frequency ranges are measured within one operation to enable a control signal to be derived therefrom.

DETAILED DESCRIPTION OF THE PREFERRED EMBODIMENT

Figure 1:
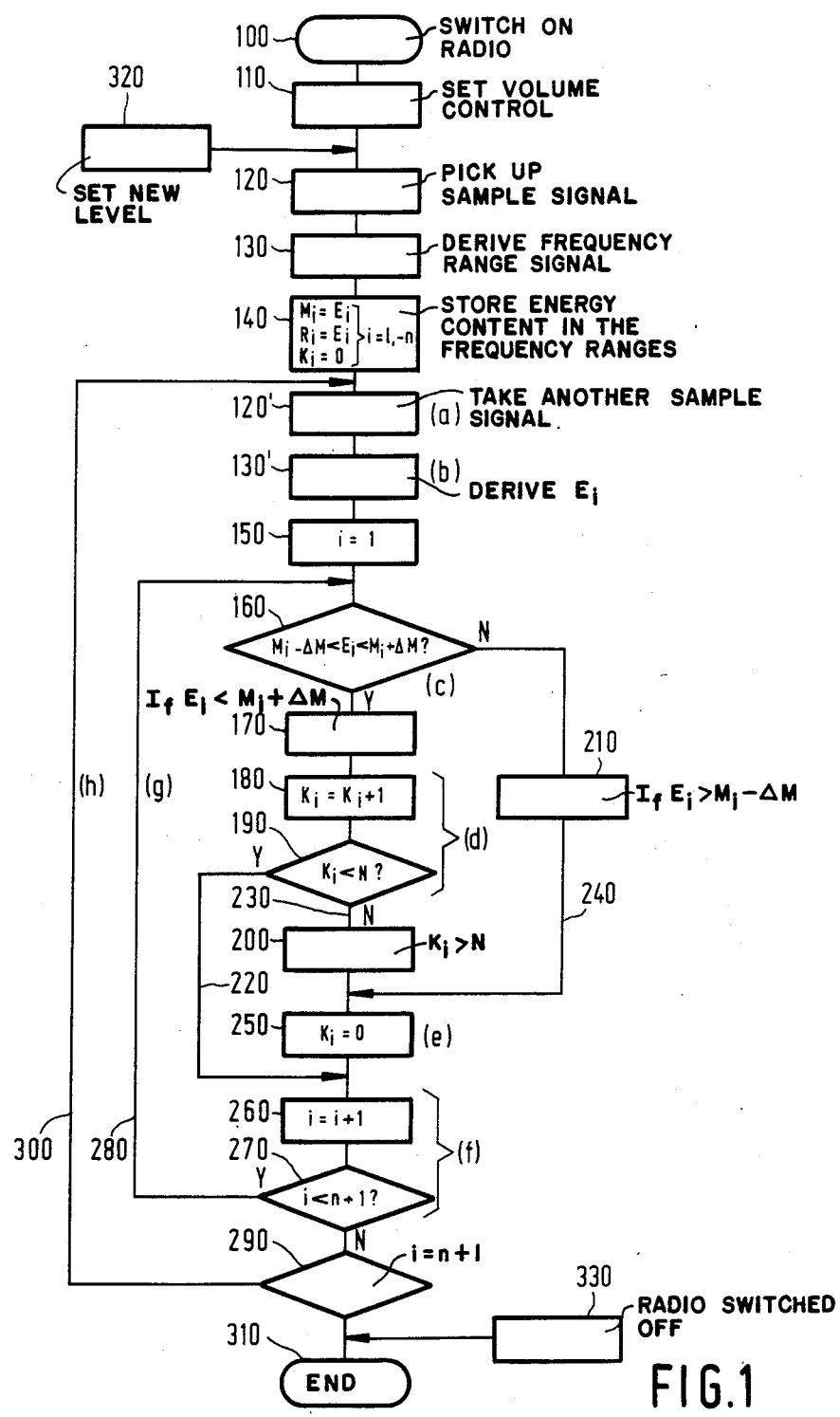
FIG. 1 is a flow chart of an example of the method.

FIG. 1 is a flow chart of the method. The program is started in block 100 in that the (car) radio is switched on. In block 110 the user now sets the volume control of the radio in such a way that the desired signal produced by the (car) radio has the desired level. This means that the user has set a specific desired difference in sound level (in dB) between the background noise level and the level of the desired signal. As will appear from the following, the program ensures that if the background-noise level increases or decreases the volume of the radio is corrected (increased and reduced, respectively) so as to maintain the difference in level set by the user.

In block 120 a microphone in the space (the passenger compartment of a car) picks up a signal and a sample comprising a portion of this microphone signal which lies within a specific time interval is taken. Subsequently, in block 130, a quantity is derived therefrom for each of n frequency ranges, which quantity is a measure of the energy content of the signal in the relevant frequency range. The values obtained for the energy content in the n frequency ranges are stored in n associated memories as values $M_i$ and in n corresponding reference memories as values $R_1$, i ranging from 1 to n inclusive. This storage is effected in block 140. Moreover, the counts $k_i$ of n counters each of which corresponds to a respective said frequency range are all set to zero.

Now the following steps are carried out in a number of consecutive operations:

(a) another sample comprising a portion of the electric (microphone) signal which lies within a specific time interval is taken. This is effected in block 120'.

(b) from this portion of the electric signal a quantity $E_i$ for all n frequency ranges is derived in block 130', which quantity is a measure of the energy content of this portion in the relevant frequency range. Subsequently, in block 150, a running variable i is made equal to 1.

(c) in block 160 the first quantity $E_1$ is compared with the value $M_1$ of the contents of the first memory of the n memories each of which correspond to one frequency range.

(d) if it is found in block 160 that the value for the first quantity obtained in block 130' lies within a range of values $\Delta M$ around the value $M_1$ stored in the first memory, i.e.

$$M_1 - \Delta M < E_1 < M_1 + \Delta M \qquad (1)$$

the count $k_1$ of the first counter corresponding to the first frequency range is incremented by one. This is effected in block 180. $\Delta M$ may have a fixed value, but this is not essential, as will appear hereinafter. Subsequently, in block 190, $k_1$ is compared with a first final value N.

If it is found in block 190 that the count $k_1$ of the first counter has not yet reached the first final value N the program proceeds to block 260 via branch 220.

If it is found in block 160 that $E_1$ lies outside the range of values around $M_1$, the program proceeds to block 250 via the branch 240. Also, in block 190 when $k_1$ is found to have reached the first final value N, the program proceeds to block 250 (via the branch 230).

(e) in block 250 the count $k_1$ of the first counter is decremented, in the present case to a first initial value, namely the value zero. Subsequently, the program proceeds to block 260.

(f) in block 260 the running variable i is incremented by one. Subsequently, the running variable is compared with a second final value n+1 in block 270.

(g) if the second final value is not yet reached, the program proceeds to block 160 via branch 280 to repeat the program from block 160 for the second frequency range (generally speaking, an adjacent range).

Thus, via the branch 280 all n frequency ranges are processed consecutively.

(h) when all n frequency ranges have been processed, the program proceeds to block 120' via the blocks 270, 290 and branch 300.

Situation 1: Now it is assumed that from the very instant at which the (car) radio was switched on the background noise in a specific frequency range i has not changed for a certain time which is shorter than the time required to allow $k_i$ to reach the value N and subsequently the level changes and remains constant for some time.

Initially, the program for the frequency range i proceeds via blocks 160, 180, 190, branch 220 and block 260 in each of several consecutive operations. The noise level changes before $k_i$ has reached the value N. In the next operation the program for the frequency range i proceeds via block 160 and branch 240. Branch 240 includes block 210. In this block 210 the value stored in the $i^{th}$ memory may be updated in one of several different ways, i.e. it may be adapted to the new measurement value in the $i^{th}$ frequency range:

(i) the value for the $i^{th}$ quantity is stored in the $i^{th}$ memory, or $M_{in} = E_i$, or (ii) from the value for the $i^{th}$ quantity and the value stored in the $i^{th}$ memory a new value is derived and is stored in the $i^{th}$ memory, for example $$M_{in} = \frac{M_{io} + E_i}{2} \qquad (2)$$

where $M_{in}$ and $M_{io}$ represent the new and the original value $M_i$ in the $i^{th}$ memory.

It is evident that other adaptations of the value in the $i^{th}$ memory are also possible.

Subsequently, the count $k_i$ of the $i^{th}$ counter is reset to zero in block 250.

As the noise level now remains constant for some time the program proceeds via blocks 160, 180, 190, branch 220 and block 260 in each of several consecutive operations until the count $k_i$ of the $i^{th}$ counter reaches the value N. As the value $M_i$ has now changed, $M_i$ will not be equal to $R_i$ and in block 200 the gain will be changed depending on the difference between $R_i$ and $M_i$. Moreover, the count $k_i$ of the $i^{th}$ counter is reset to zero in block 250.

Situation 2: It is now assumed that some time after the car radio has been switched on the driver starts to talk with with a passenger. Initially, the program will proceed via blocks 160, 180, 190, branch 220 and block 260. From the instant at which the driver and the passenger start talking the program will proceed either via branch 240 or via branch 220 in consecutive operations for the $i^{th}$ frequency range because speech varies in time, so that in principle $k_i$ cannot reach the value N. Therefore, the gain of the amplifier will not be adapted, which is required, as stated previously.

If during the time that the driver and the passenger talk with each other the background noise has changed to another level, the gain will not be adapted. Only if the persons in the car have not talked for a sufficiently long time (so long that $k_i$ can reach the value N in consecutive operations), an adaptation to the new noise level will be effected.

In the first situation described above it has been stated that the value stored in the $i^{th}$ memory should be updated in order to adapt this value to the new (measured) noise level in the $i^{th}$ frequency range. If the measured noise level does not vary (the program thus proceeds to block 180 via block 160 the value stored in the $i^{th}$ memory in principle need not be updated.

However, even in this case it may be useful to update the value stored in the $i^{th}$ memory because this enables a more accurately measured average background level to be obtained. Updating may be effected in for example the same way as described for the first situation. Updating is then effected in block 170.

If the amplifier has a gain factor which is independently variable in n frequency ranges, which frequency ranges as regards their position and width in the spectrum correspond to the n frequency ranges within which the energy content of the signal sample is determined in block 130', it is preferred, if in a specific frequency range i it has been found in block 190 that the $i^{th}$ counter $k_i$ has reached the first final value N, to adapt the gain factor in the $i^{th}$ frequency range immediately after this. Therefore, block 200 is situated directly after the block 190 in the flow chart. However, it is also possible to adapt the gain factors in the n frequency ranges only once during an operation, for example at the end of this operation. In such a case a memory is required which stores the frequency ranges for which the associated counter $k_i$ has reached the first final value N. Block 200 is now located, for example, between blocks 270 and 290, so that upon termination of the operation the gains in the relevant ones of the n frequency ranges can be adapted.

If the amplifier has one gain factor for the entire frequency range it is preferred to adapt the gain factor at the end of an operation although, in principle, it is also possible to effect adaptation immediately after block 190 by means of block 200.

In the foregoing it has been assumed that after receipt of a sample of the microphone output signal in block 120' the quantities $E_1$ to $E_n$ for all n frequency ranges are derived in block 130'. However, as an alternative the quantity $E_i$ may be determined for only one frequency range i in block 130'. In that case the flow chart may be as follows:

1. in block 120' the microphone signal sample is taken and stored, for example in digital form.

In block 130' only one quantity $E_i$ is derived. Block 150 should then be situated between blocks 120' and 130' and branch 280 should join the main program branch before block 130', so that after block 270, in block 130', the quantity $E_i$ for the next frequency range can be derived from the microphone signal sample stored in block 120'.

2. In block 120' a microphone signal sample is received but is not stored. In block 130' only one quantity $E_i$ is derived. From the point where branch 300 joins the main program branch the sequence of the blocks is now as follows: first block 150—subsequently, branch 280 to the main program branch—then block 120' and finally block 130'. Thus, for each frequency range a new microphone signal sample is taken.

If the user is not satisfied with the level of the desired signal which he has set by means of the volume control (the difference in level between the desired signal and the background-noise level may be too large or too small) he can set a new level (difference) by turning the volume control. The program now automatically jumps to block 320 and starts from the beginning with the taking of a microphone signal sample in block 120.

The program may now be terminated via block 290 to block 310 or from block 330 to block 310. Block 330 indicates that the program stops because the radio is switched off. The program may be terminated via block 290, for example in that the control system is disabled by means of a control on the radio with which the noise-dependent volume control can be switched on and off.

A method in which only one frequency range is measured within one operation in order to obtain the control signal can be derived in a simple manner from the flow chart of FIG. 1 by omitting blocks 260 and 270, branch 280 and block 150.

Figure 2:
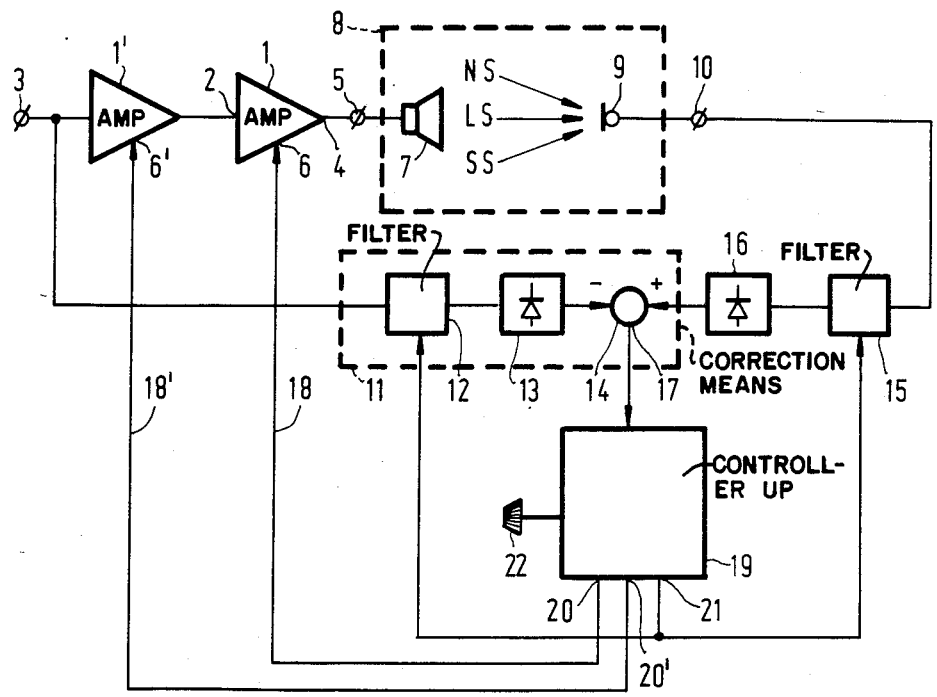
FIG. 2 shows schematically a device for carrying out the method.

FIG. 2 shows a device for carrying out the method described with reference to FIG. 1. The device comprises an amplifier (1') whose gain is variable depending on the control signal, which amplifier has an input coupled to a first input terminal 3 for receiving an electric signal to be amplified, an output 4 coupled to an output terminal 5 for supplying an output signal, and a control input 6 for receiving the control signal. A loudspeaker 7 is connected to the output terminal 5. The loudspeaker 7 converts the electric signal on the output terminal 5 into an acoustic signal which is radiated into the space 8 in which the loudspeaker 7 is situated. A microphone 9 is also situated in the space 8 and is coupled to a second input terminal 10 of the device. The microphone 9 detects the acoustic signal in the space 8, which signal generally comprises three components, namely the contribution of the desired signal or the loudspeaker signal LS produced by the loudspeaker 7, the contribution of the background noise NS produced by an independent sound source, and a contribution corresponding to the speech signal SS uttered by a speaker in the space 8.

In order to obtain a correction for the contribution LS in the microphone signal which is applied to the device via the second input terminal 10, the device comprises correction means 11. The correction means 11 comprise a filter 12, a rectifier 13, and a signal combination unit 14. Via a filter 15 and a rectifier 16 the second input terminal 10 is also coupled to the signal combination unit 14. The signal combination unit 14 combines the signals from the rectifiers 13 and 16 in such a way that in the absence of the speech signal SS and the background noise NS, (substantially) no signal appears on the output 17 of the signal combination unit 14 for each of the n frequency ranges defined by the (adjustable) filters 12 and 15. Such a method of reducing the influence of the signal LS amplified by the amplifier 1 on the control signal which is applied to the control input 6 of the amplifier 1 via the line 18 is known per se. However, correction may also be effected in a different manner.

When there is background noise NS and a speech signal SS, an electric signal will appear on the output 17 of the signal combination unit 14, which signal is a measure of the sum of these two signals. This signal is applied to a microprocessor 19 which produces a control signal on its output 20 for application to the amplifier 1 via the line 18, and another control signal on its output 21 for application to the adjustable filters 12 and 15. It is evident that the filters 12 and 15 may be controlled in such a way that they are always set to identical frequency ranges.

Of course, the correction means 11 may be equipped with a filter bank 12 comprising n parallel filters corresponding to the n frequency ranges. In this case n rectifiers and n signal combination units are needed. The filters then need not be controlled and the n signals thus obtained should be processed later in the circuit.

Further, the microprocessor 19 is connected to a volume control 22 which can be operated by the user in order to set a specific difference in level between the desired sound LS and the background noise NS. In the present embodiment this difference in level, as will appear hereinafter, is obtained by means of an auxiliary amplifier 1' which for this purpose receives a control signal from an output 20' of the microprocessor 19 via a control input 6' and the line 18'. The device and, in particular, the microprocessor 19 will be described in more detail with reference to FIG. 3.

Figure 3:
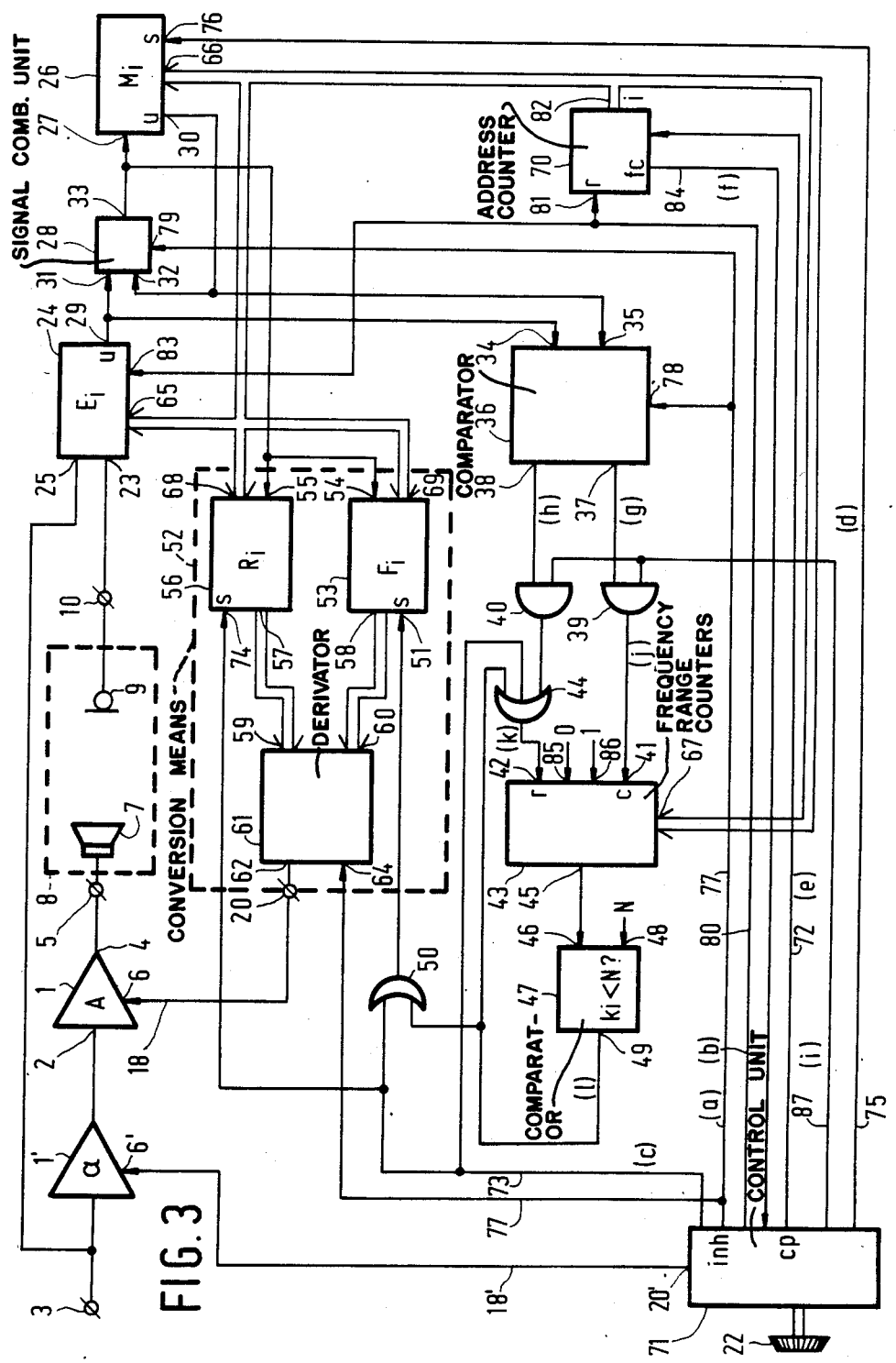
FIG. 3 shows this device in more detail.

In FIG. 3 the second input terminal 10 is coupled to an input 23 of a first unit 24. The first unit 24 is adapted to derive the quantity $E_i$ for a frequency range i from a portion of the electric signal (appearing on the output 17 of the signal combination unit 14 in FIG. 2) which lies within a specific time interval, which quantity is a measure of the energy content of this portion in the relevant frequency range. This means that the first unit 24 in FIG. 3 in fact comprises the correction means 11, the filter 15 and the rectifier 16 of FIG. 2. This can be seen because the first input terminal 3 is coupled to another input 25 of the first unit 24 via a direct electrical interconnection. The device further comprises a second unit 26 and a signal combination unit 28. The outputs 29 and 30 of the first unit 24 and the second unit 26, respectively, are coupled to a first input 31 and a second input 32, respectively, of the signal combination unit 28, which has an output 33 coupled to an input 27 of the second unit 26. The second unit 26 comprises n memories, each corresponding to a respective one of the n frequency ranges, whose contents $M_i$ are a measure of the energy content of the electric signal in the relevant frequency ranges. The operation and the function of the signal combination unit 28 will be described in more detail hereinafter.

The outputs 29 and 30 of the first unit 24 and the second unit 26, respectively, are coupled to a first input 34 and a second input 35, respectively, of a first comparator 36. The comparator 36 compares the quantities applied to its first input 34 and its second input 35 by the first unit 24 and the second unit 26, respectively with each other. A first output 37 of the comparator 36 is coupled to a count input 41 of a third unit 43 via an AND-gate 39. A second output 38 of the comparator 36 is coupled to a reset input 42 of the third unit 43 via an AND-gate 40 and an OR-gate 44. The third unit comprises n counters, each corresponding to a respective one of the n frequency ranges. An output 45 of the third unit 43 is coupled to a first input 46 of a second comparator 47. The second comparator 47 also comprises a second input 48 for the first final value N. The second comparator 47 is adapted to compare the count of the $i^{th}$ counter of the third unit 43 with the first final value N. The output 49 of the second comparator 47 is coupled to the reset input 42 of the third unit 43 via the OR-gate 44. The output 49 is also coupled to a set (or load) input 51 of a fifth unit 53 via an OR-gate 50, which fifth unit 53 forms part of conversion means 52 and comprises n memories each corresponding to a respective one of the frequency ranges. The output 33 of the signal combination unit 28 is coupled to an input 54 of the fifth unit 53 and to an input 55 of a fourth unit 56, which unit 56 also forms part of the conversion means 52. The fourth unit 56 comprises n memories, each corresponding to a respective one of the n frequency ranges, for storing n reference values each corresponding to the relevant one of the frequency ranges. The outputs 57 and 58 of the fourth unit and the fifth unit are coupled to a first input 59 and a second input 60, respectively, of a sixth unit 61 which also forms part of the conversion means 52. The sixth unit 61 is adapted to derive a control signal from the signals applied to its two inputs 59 and 60 and to produce this control signal on its output 62, which output 62 serves as the output of the conversion means 52. The output 62 of the sixth unit 61 constitutes the output 20 of the microprocessor 19 in FIG. 2.

For applying addresses to the address inputs 65, 66, 67, 68 and 69 of the first, the second, the third, the fourth and the fifth unit, respectively, the arrangement comprises an address counter 70. The address counter 70 cyclically supplies n addresses i corresponding to the n frequency ranges to the aforementioned units via the line 82. The address counter 70 receives clock pulses from a central control unit 71 via the line 72. Further, the following lines issue from the central control unit 71: a line 73 which is coupled to a set (or load) input 74 of the fourth unit 56, to the set (or load) input 51 of the fifth unit 53 via the OR-gate 50 and to the reset input 42 of the third unit 43 via the OR-gate 44; a line 75 which is coupled to a set (or load) input 76 of the second unit 26; a line 87 which is coupled to the inputs 41 and 42 of the third unit 43 via the AND-gates 39 and 40, respectively; a line 77 which is coupled to a control input 64 of the sixth unit 61 and to an inhibit input 78 and an inhibit input 79 of the first comparator 36 and the signal combination unit 28, respectively; a line 80 which is coupled to a reset input of the address counter 70 and to an input 83 of the first unit 24; and a line 18' from the output 20' to the control input 6' of the auxiliary amplifier 1'. Further, a line 84 extends from the address counter 70 to the central control unit 71.

The device of FIG. 3 operates as follows. Firstly, initialising, i.e. obtaining the initial setting, will be explained by means of FIG. 4 which represents a number of signals appearing on a number of points in the device as a function of time. Subsequently, the actual measurement will be explained by means of FIGS. 5 and 6, which also show a number of signals appearing on a number of points in the device as a function of time.

1. Initialisation

It is assumed that the amplifier 1 and the auxiliary amplifier 1' have a gain factor A and $\alpha$, respectively, which factors each have the same value for all the frequency ranges.

At a specific instant $t_1$ the user turns the volume control 22 to adjust the gain factor $\alpha A$ of the device in order to obtain a specific difference in level between the desired sound LS and the background noise NS. The central control unit 71 now feeds a control signal, see FIG. 4, curve (a) to the sixth unit 61 via the line 77, so that such a control signal appears on output 62 and is applied to the amplifier 1 that the gain factor A of the amplifier 1 is set to the value 1. Moreover, the central control unit 71 applies such a control signal to the amplifier 1' via the line 18' that the gain factor $\alpha$ of the device (A is 1) is exactly such that the desired difference in level between the desired signal and the background noise is obtained. Subsequently, the control unit 71 produces a pulse via the line 80, see FIG. 4, curve (b). This pulse resets the address counter 70 to an initial setting, for example 0000 . . . 00, corresponding to the address of the first frequency range. Moreover, in the first unit 24 the pulse initiates:

1. the sampling of a portion of the electric signal which appears on output 17 of FIG. 2 which lies within a specific time interval,
2. determination of the quantities $E_i$, which are measures of the energy contents of the relevant portion in the associated frequency ranges,
3. the storage of the quantities $E_i$ in n associated memories.

In the foregoing it has been assumed that the first unit 24 comprises n parallel-operating filters for the n frequency ranges. Subsequently, the control unit 71 produces a pulse on the two lines 73 and 75 at the instant $t_2$, see FIGS. 4, curve (c) and 4(d). Via the OR-gate 44 this pulse is applied to the reset input 42 of the third unit 43 and ensures that the number (which is always a zero) presented to the input 85 of the third unit 43 is loaded into the first counter, i.e. $k_1=0$. This is because the address 00 . . . 00 is applied to the address input 67. Moreover, as the address corresponding to the first frequency range is applied to the address inputs 65, 66, 68 and 69 of the first unit 24, the second unit 26, the fourth unit 56, and the fifth unit 53, respectively, the quantity $E_1$ appearing on the output 29 of the first unit is applied to the second, the fourth and the fifth unit via the signal combination unit 28 and after application of said pulse to the load input 76 via the line 75 and to the load inputs 74 and 51 via the line 73 it is stored at those storage locations in these three units 26, 56 and 53 which correspond to the first frequency range. Since the said control signal is also applied to the input 79 of the signal combination unit 28 via the line 77, the unit 28 merely functions as an electrical interconnection between the input 31 and the output 33.

Figure 4:
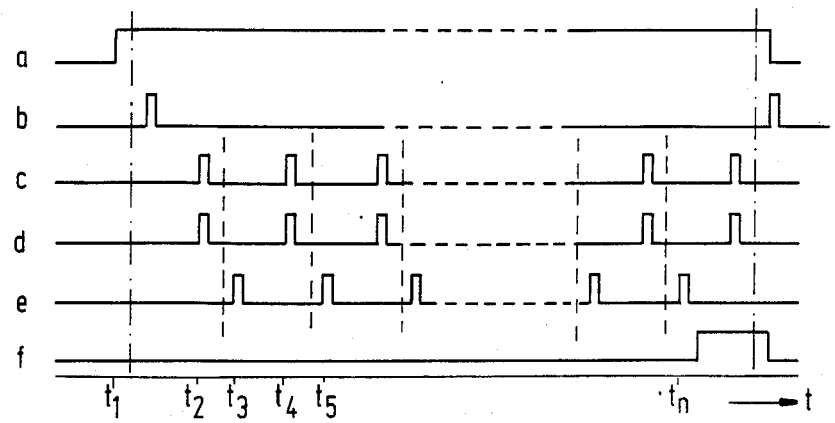

Subsequently, the control unit 71 supplies a clock pulse to the address counter 70 via the line 72 at the instant $t_3$, see FIG. 4, curve (e), so that the address counter is incremented by one and the address 00 . . . 01 appears on the output and, consequently, on the line 82. At the instant $t_4$ the control unit 71 now sends a pulse via the lines 73 and 75, see FIG. 4, curves (c) and (d), so that the quantity $E_2$ appearing on the output 29 of the first unit 24 is applied to the second unit 26, the fourth unit 56, and the fifth unit 53 via the signal combination unit 28 and is stored therein in a memory corresponding to the second frequency range. Subsequently, the address counter 70 receives another clock pulse via the line 72 at the instant $t_5$, see FIG. 4, curve (e), so that the next address appears on the line 82 and the quantity $E_3$ can be stored in the second, the fourth and the fifth unit by means of the next pulse via the lines 73 and 75. This continues until after a pulse at the instant $t_n$, see FIG. 4, curve (e), via the line 72 the address counter reaches the count "n" corresponding to the $n^{th}$ frequency range and the quantity $E_n$ is stored in the second, the fourth and the fifth unit under the influence of a pulse on the lines 73 and 75. The address or count "n" is also the maximum count of the address counter 70. This means that the counter is "full". Via the fc (full-counter) output of the address counter 70 a signal is now applied to the control unit 71 via the line 84, see FIG. 4, curve (f). The control signal on the line 77, see FIG. 4, curve (a), now disappears, so that the signal combination unit 28 and the first comparator 36 are enabled. The sixth unit 61 is now also enabled. This is no problem because the contents of the fourth unit 56 and the fifth unit 53 are equal. The sixth unit is adapted so that upon application of the contents $R_1$ and $F_i$ of the two units 56 and 53 to the output 62 it supplies a control signal which ensures that the gain of the amplifier 1 becomes 1x. Initialisation is now complete.

The measurement

At the instant $t_1$, see FIG. 5, curve (b), a pulse appears on the line 80. In the first unit 24 this pulse again initiates the taking of a signal sample and the determination of the quantities $E_1$ to $E_n$. Since the count of the address counter is 00 ... 00, the quantities $E_1$ and $M_1$ are applied from the outputs 29 and 30 of the first unit 24 and the second unit 26, respectively, to the inputs 34 and 35, respectively, of the first comparator 36. In the first comparator 36 it is ascertained whether $M_1 - \Delta M < E_1 < M_1 + \Delta M$. If this is the case, output 37 goes "high". If it is not the case, output 38 goes "high". It is now assumed that output 37 is "high", see FIG. 5, curve (g). Via the line 87 a pulse is applied to the AND-gates 39 and 40 at the instant $t_2$, see FIG. 5, curve (i). This pulse is transferred by the AND-gate 39 only, so that a counting pulse is applied to the input 41 of the third unit 43, see FIG. 5, curve (j). As the address 00 ... 00 is also applied to the address input 67 of the third unit 43, the count of the first counter in the third unit is incremented by one, so that $k_1 = 1$. The count of the first counter appears on the output 45 of the third unit. Since in the second comparator 47 it is found that $k_1 < N$, the output signal on the output 49 of the second comparator 47 is "low", see FIG. 5, curve (l).

Subsequently, at the instant $t_3$ see FIG. 5, curve (d), a pulse is applied to the load input 75 of the second unit 26 via the line 75, so that the output signal of the signal combination unit 28 is loaded into the first memory of the second unit. The new $M_1$, being $M_{1n}$, is therefore a function of the previous $M_1$, being $M_{1o}$, and $E_1$, for example in conformity with:

$$M_{1n} = \frac{M_{1o} + E_1}{2}$$

or, more generally, $$M_{in} = \frac{M_{io} + E_i}{2} \quad (2)$$

Subsequently, at the instant $t_4$, see FIG. 5, curve (e), a clock pulse is applied to the address counter 70 via the line 72, so that the address 00 ... 01 corresponding to the second frequency range appears on the line 82. From the outputs 29 and 30 of the units 24 and 30, respectively, the quantities $E_2$ and $M_2$ are applied to the inputs 34 and 35, respectively, of the comparator 36. It is now assumed that $E_2$ falls outside the limits $M_2 - \Delta M$ and $M_2 + \Delta M$. This means that output 37 goes "low",
see FIG. 5, curve (g) and output 38 goes "high" see FIG. 5, curve (h). Now the control unit 71 supplies a pulse at the instant $t_5$ via the line 87, see FIG. 5(i), which pulse is only transmitted via the AND-gate 40 and is applied to the reset input 42 of the third unit 43 via the OR-gate 44, see FIG. 5, curve (k). The count of the second counter is set to zero ($k_2 = 0$). In the second comparator 47 it is now determined that $k_2 < N$, so that output 49 of the comparator 47 remains "low", see FIG. 5, curve (l). Via the line 75, see FIG. 5(d), a pulse is produced at the instant $t_6$, so that the value $M_2$ in the second unit may be replaced by the value on output 33 of the signal combination unit 28.

Via the line 72, see FIG. 5, curve (e), a pulse is applied to the address counter 70 at the instant $t_7$ and via the line 82 the address 00 ... 10 is applied to the first unit 24 and the second unit 26. In the first comparator 36 $E_3$ and $M_3$ are compared with each other, after which, as will appear from FIG. 5, curve (j), the third counter in the third unit 43 is incremented by 1, i.e. $k_3 = 1$. This continues until all frequency ranges have been processed. At the instant $t_8$ the signal indicating that the address counter 70 is full appears on the line 84, see FIG. 5, curve (f). Some of the counters in the third unit 43, such as the first, the third, the $(n-1)^{th}$ and $n^{th}$ counter, now have a count 1, see FIG. 5, curve (j), and some counters such as the second counter, see FIG. 5, curve (k) still have a count of zero. FIG. 5 relates to one operation. Such an operation is now repeated using a new sample of the input signal which lies within a specific time interval and which is captured via the first unit 24.

At a given instant the counter which corresponds to a specific frequency range i reaches the count N. How the program proceeds then is described with reference to FIG. 6. At the instant $t_1$ a pulse is applied to the address counter via the line 72, see FIG. 6, curve (e), so that subsequently the address i appears on its output 82. When $M_i$ is compared with $E_i$ in the first comparator 36 it is found that $E_i$ lies within the specified limits, so that the output 37, see FIG. 6, curve (g), goes high. The pulse on the line 87, see FIG. 6, curve (i), at the instant $t_2$ is therefore transferred by the AND-gate 39, see FIG. 6, curve (j), so that the $i^{th}$ counter is incremented by one and reaches the value N. Consequently, the output 49 of the second comparator 47 goes high at the instant $t_3$, see FIG. 6, curve (l). This rising edge at the instant $t_3$ is applied to the reset input 42 of the third unit 43 via the OR-gate 44, see FIG. 6, curve (k), so that the count $k_i$ is reset to zero. The output 49 of the comparator 47 subsequently goes low at the instant $t_4$, see FIG. 6, curve (l). The pulse which in fact appears on output 49 is also applied to the load input 51 of the fifth unit 53 via the OR-gate 50, so that the quantity $M_{in}$ on the output 33 of the signal combination unit 28 is stored in the $i^{th}$ memory of the fifth unit 53.

Signals $F_i$ different from the ones previously applied are now applied from the fifth unit 53 to the input 60 of the sixth unit 61. This results in a change of the control signal produced on the output 62 of the sixth unit 61 and applied to the amplifier 1. If the quantity $M_{in}$ is larger than the original value $F_i$, the noise level has apparently increased. The gain factor A is consequently increased from the set value, which until now was 1, to the new adapted value A, where $A > 1$. If the quantity $M_{in}$ is smaller than the original value $F_i$, the noise level has decreased. Consequently, the gain factor will be corrected to obtain a value A<1.

A control signal for the entire frequency ranges can be obtained in the sixth unit 61, starting from the quantities $F_i$ and $R_i$ in n frequency ranges, by adding the dB values of the signals from the various filters to each other, provided that the separation between the filter characteristics is satisfactory. If the separation is not satisfactory a correction must be applied, which correction is known per se. p If the amplifier 1 has a gain $A_1$ to $A_n$ which is adjustable in n separate frequency ranges, the sixth unit 61 should supply n control signals to the control input 6 of the amplifier 1. From each set of quantities $R_i$ and $F_i$ from the fourth unit 56 and the fifth unit 53, respectively, which correspond to a frequency range i, a control signal $r_i$ should then be derived. This may be effected in such a way that an increase of the background-noise level in a frequency range by×dB (× representing a specific value) causes the gain A in said frequency range to be increased by $\delta \times$dB. Depending on the control system $\delta$ will be selected to be smaller than or equal to one.

In the foregoing it has been stated that in all cases the contents of the second unit 26 has been updated in that for each frequency range i, regardless of whether $E_i$ lies within or outside the range of values around $M_i$, a pulse is applied to the input 76, so that the signal on the output 33 of the signal combination unit 28 is read into the $i^{th}$ memory of the second unit 26.

Figure 7:
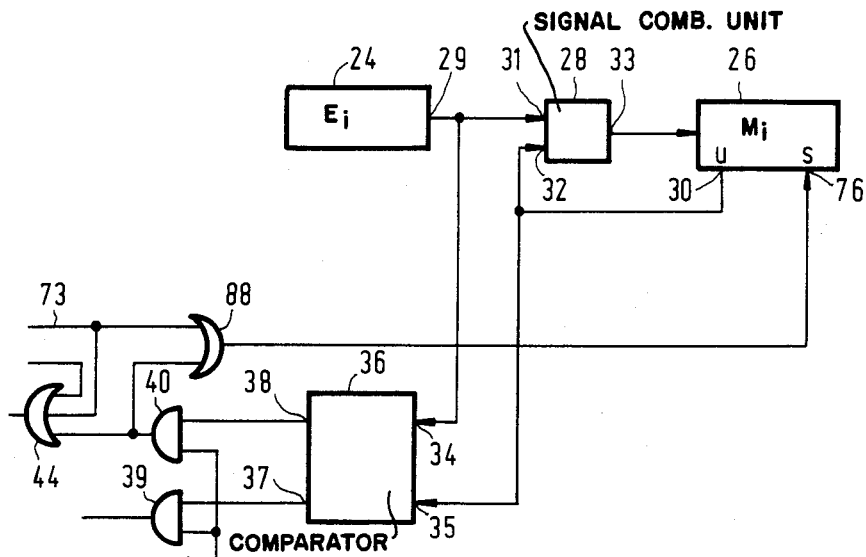
FIG. 7 shows another device which is a slightly modified version of that shown in FIG. 3.

FIG. 7 shows another embodiment in which the contents of the second unit 26 are not refreshed in all cases. FIG. 7 only shows the essential elements of the device of FIG. 3 and the modifications to be made thereto. Instead of an output of the control unit 71 being coupled to the load input 76 of the second unit 26, the output of the AND-gate 40 is now coupled to this load input 76 via an OR-gate 88. Moreover, the control unit 71 is now coupled to the load input 76 via the line 73 and the OR-gate 88.

During initialisation pulses are applied to the load input 76 via the line 73, so that the second unit is now filled with the new quantities $M_i$. During the measurement, only if the first comparator 36 has established that the quantity $E_i$ lies outside the range of values around the value stored in the $i^{th}$ memory of the second unit 26, a pulse appears on the output of the AND-gate 40 and is applied to the load input 76 via the OR-gate 88, and the value on the output 33 of the combination unit 28 is stored in the $i^{th}$ memory of the second unit.

In the foregoing the operation of the device was such that the gain A of the amplifier 1 was adapted immediately after the second comparator had detected that the count $k_i$ had reached the value N.

Figure 8:
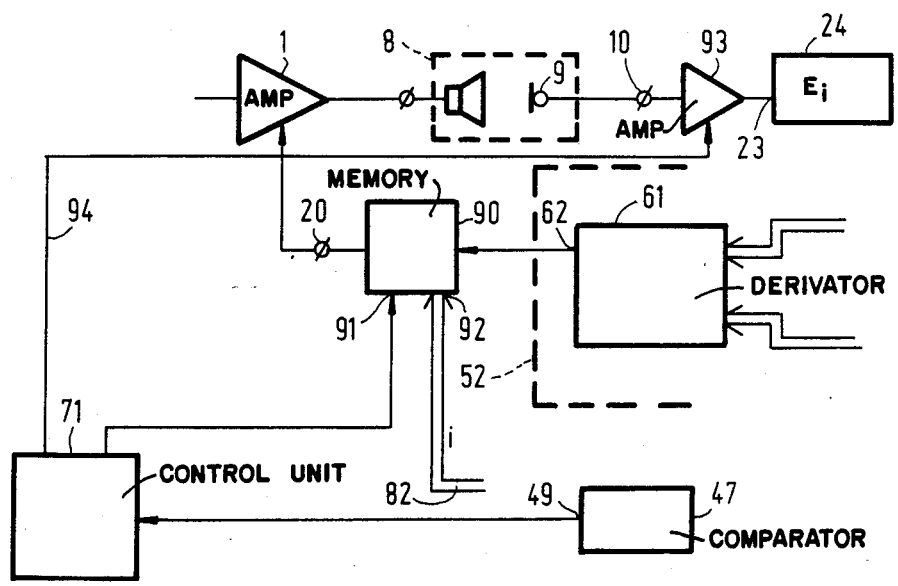
FIG. 8 shows another example of the device which is also a slightly modified version of the device shown in FIG. 3.

FIG. 8 shows a further embodiment in which the gain is adapted only once per operation, suitably at the end. FIG. 8 only shows the essential elements of the device of FIG. 3 and the modifications to be made thereto. Between the output 62 of the sixth unit 61 and the terminal 20 a seventh unit 90 is arranged. The seventh unit 90 is adapted to store the value of the control signal from the sixth unit. The seventh unit 90 comprises a load input 91 for receiving a control signal from said control unit 71 at least once during an operation, if during this operation the count of the counter i of the third unit 43 is found to have reached the first final value N for at least one frequency range. For this purpose the output 49 of the second comparator 47 is also coupled to an input of the central control unit 71.

If the amplifier 1 has a gain factor which is adjustable independently for each of the n frequency ranges the seventh unit 90 should be adapted to store n values corresponding to the n control signals from the sixth unit 61 for adjusting the gain of the amplifier. Moreover, the seventh unit 90 then has an address input 93, which is coupled to the output of the address counter 70 via the line 82.

The choice for the value N of the first final value is rather arbitrary. However, it must be taken into account that N should be larger than or equal to the aforesaid lower limit defined by the maximum duration of a speech utterance and the measurement time of an operation. For example, N may have a value of 600.

Further, FIG. 8 shows a controllable amplifier 93 arranged between the second input terminal 10 and the input 23 of the first unit 24. The gain of this amplifier is controlled by the central control unit 71 via the line 94. This amplifier may be employed to adapt the level of the electric signal on the input 10, if necessary, to the range of an analog-to-digital converter in the unit 24.

The comparison of the quantity $E_i$, corresponding to the energy content in the $i^{th}$ frequency range, with the value $M_i$ of the contents of the $i^{th}$ memory in block 160 in FIG. 1 or in the first comparator 36 in FIG. 3 may also be effected in a way other than that defined by means of formula (1). For example, another possibility is the following.

Firstly, a quantity X is derived from the measured value $E_i$ and the value $M_{io}$ stored in the memory in conformity with:

$$X = |E_i - M_{io}| \qquad (3)$$

Moreover, $M_{in}$ is determined in conformity with formula (2). Subsequently, the following decision criterion is applied:
(a) if $$X \leq (M_{in}/10) \qquad (4)$$

the program of FIG. 1 proceeds via block 180, and
(b) if $$X > (M_{in}/10) \qquad (5)$$

the program of FIG. 1 proceeds via branch 240.

Inserting formula (3) into formula (4) eventually yields $$M_{io} - \Delta M_i < E_i < M_{io} + \Delta M_i \qquad (6)$$

where $$\Delta M_i = (M_{in}/10) \qquad (7)$$

From (6) and (7) it follows that the detection criterion of formula (4) means that eventually the measured value ($E_i$) is compared with the value ($M_{io}$) stored in the $i^{th}$ memory. Moreover, it will be evident from formula (7) that $\Delta M_i$ is not fixed.

TABLE

| Block number | Inscription |
|---|---|
| 100 | start |
| 110 | initial gain setting |
| 120, 120' | input of time signal |
| 130, 130' | derivation of $E_i$ |
| 140 | storage in memories |
| 160 | comparison step |
| 170 | refresh $M_i$ |

TABLE-continued

| Block number | Inscription |
|---|---|
| 180 | increase $k_i$ |
| 200 | adaptation of gain setting |
| 210 | refresh $M_i$ |
| 250 | decrease $k_i$ |
| 260 | increase i |
| 290 | control switched off |
| 310 | stop |
| 320 | adjustment to new initial gain setting |
| 330 | radio switched off. |

What is claimed is:

1. A method of adapting the gain of an amplifier to the level of the background noise produced in a space by an independent sound source wherein an acoustic signal in the space is detected by detection means and converted into an electric signal, after which a control signal which is a measure of the background-noise level is derived, depending on the control signal, the gain of the amplifier being increased in the case of an increase of the background-noise level and reduced in the case of a reduction of the background-noise level, wherein, for a specific gain setting of the amplifier and specific contents of at least one memory corresponding to an associated frequency range, for each of successive operations, the method comprising the steps of:
   (a) taking a sample having a portion of the electric signal situated within a specific time interval;
   (b) deriving a quantity from said electric signal sample for said frequency range, the quantity being a measure of the energy content of said portion in the frequency range;
   (c) comparing the quantity corresponding to the energy content in the frequency range with the value of the contents of the memory;
   (d) incrementing the count of a counter which corresponds to the frequency range by a first number and subsequently comparing the count of this counter with a first final value if it is found in step (c) that the value obtained for the quantity in step (b) is within a range of values around the value stored in the memory;
   (e) incrementing the count of the counter by setting the count to a first initial value if it is found in step (c) that the value obtained for the quantity in step (b) is outside the range of values around the values stored in the memory or if it is found in step (d) that the count of the counter had reached the first final value;
   (f) repeating the operation from step (a) for a new sample having a portion of the electric signal situated within a specific time interval;
wherein if, during an operation, the count of the counter has reached the first final value for the frequency range, the gain of the amplifier is adapted.

2. A method of adapting the gain of an amplifier to the level of the background noise produced in a space by an independent sound source, wherein an acoustic signal in the space is detected by detection means and converted into an electric signal, after which a control signal which is a measure of the background-noise level is derived, depending on the control signal, the gain of the amplifier being increased in the case of an increase of the background-noise level and reduced in the case of a reduction of the background-noise level, wherein for a specific setting of the gain of the amplifier and specific contents of n memories each of which corresponding to a respective one of n frequency ranges with $n \geq 2$, the method for each of successive operations comprising the steps of:
   (a) taking a sample having a portion of the electric signal situated within a specific time interval;
   (b) deriving a quantity from the sample for a frequency range i, the quantity being a measure of the energy content of said portion in the relevant frequency range;
   (c) comparing the $i^{th}$ quantity, corresponding to the energy content in the $i^{th}$ memory of the n memories, with the value of the contents of the $i^{th}$ memory of the n memories, each of the n memories corresponding to a respective frequency range;
   (d) incrementing the count of one of n counters, each corresponding to an associated frequency range, by a first number and subsequently comparing the count of the one counter with a first final value if it is found in step (c) that the value for the $i^{th}$ quantity obtained in step (b) lies within a range of values around the value stored in the $i^{th}$ memory;
   (e) decrementing the count of the counter corresponding to the $i^{th}$ frequency range by setting the count to a first initial value if in step (c) the value for the $i^{th}$ quantity obtained in step (b) is found to lie outside the range of values around the value stored in the $i^{th}$ memory of if in step (d) the count of the counter is found to have reached the first final value;
   (f) incrementing the value i by a second number and comparing the incremented value with a second final value if it is found in step (d) that the count of the counter has not yet reached the first final value or if step (e) is carried out;
   (g) continuing the method from at least step (c) for another frequency range if it is found in step (f) that the value i has not yet reached the second final value;
   (h) repeating the operation form step (a) for a new sample including a portion of the electric signal which lies within a specific time interval if it is found in step (f) that the value i has reached the second final value, the value for i being set to a second initial value before step (c) is carried out again;
wherein if, during an operation, the count of the associated counter is found to have reached the first final value for at least one frequency range i, the gain of the amplifier is adapted.

3. A method as claimed in claim 2, for adapting the frequency-dependent gain of the amplifier in said n frequency ranges, further comprising the step of:
   adapting the gain of the amplifier in the $i^{th}$ frequency range if, during an operation, it is found for at least one frequency range that the count of the associated counter has reached the first final value.

4. A method as claimed in claim 2, further comprising the step of:
   deriving a new value for the $i^{th}$ quantity in step (c) and storing the derived new value in the $i^{th}$ memory if it is found in step (c) that the value obtained for the $i^{th}$ quantity in step (b) lies outside the range of values around the value stored in the $i^{th}$ memory, starting from the value for the $i^{th}$ quantity obtained in step (b) and the value of the contents of he $i^{th}$ memory.

5. A method as claimed in claim 2, wherein step (c), starting from the value for the $i^{th}$ quantity obtained in step (b) and the value of the contents of the $i^{th}$ memory, comprises:

deriving a new value for the $i^{th}$ quantity and storing the new derived value in the $i^{th}$ memory.

6. A method as claimed in claim 2, wherein step (c), starting from the value for the $i^{th}$ quantity obtained in step (b) or the value of the contents of the $i^{th}$ memory, comprises:

deriving a new value for the $i^{th}$ quantity and storing the new derived value in the $i^{th}$ memory.

7. A method as claimed in claim 2, wherein step (d) comprises:

adapting the gain of the amplifier if it is found that for a frequency range i, the count of the associated counter has reached the first final value.

8. A method as claimed in claim 2, further comprising the step of:

adapting the gain of the amplifier at the end of the operation if, during one operation, it is found that for at least one frequency range i, the associated counter has reached the first final value.

9. A method as claimed is claim 2, wherein step (b) further comprises:

deriving the associated quantities for all frequency ranges; and wherein step (f) further comprises:

proceeding from step (c) it is found that the value i has not yet reached the second final value.

10. A method as claimed in claim 2, wherein step (b) further comprises:

deriving said quantity for only one frequency range i; and continuing the method from at least step (b) by determining the quantity which is a measure of the energy content of the relevant portion in another frequency range if it is found in step (f) that the value i has not yet reached the second final value; and wherein step (h), further comprises:

setting the value for i to a second initial value if the operation is repeated from step (a), prior to step (b) being repeated.

11. A device for adapting the gain of an amplifier to the level of background noise produced in a space by an independent sound source, the device operable through n frequency ranges, the device comprising:

an amplifier the gain of which is controllable by a control signal, the amplifier having a control input for receiving the control signal and an input coupled to a first input terminal for receiving an electric signal to be amplified, the amplifier further having an output coupled to an output terminal for supplying an output signal;

a second input terminal for receiving an electric signal, the electric signal being a measure of the acoustic signal in the space;

conversion means having an output coupled to the control input of the amplifier, the conversion means deriving the control signal representative of a measure of the background-noise level;

correction means electrically connected to the amplifier for at least substantially correcting for the influence of the signal amplified by the amplifier on the control signal;

a first unit having an input coupled to the second input terminal for deriving for a frequency range, from a portion of the electric signal situated within a specific time interval, a first quantity representative of a measure of the energy content of said portion in the relevant frequency range, a second unit having an input coupled to an output of the first unit and an output, the second unit including a memory, corresponding to the frequency range, for storing a first value representative of a measure of the energy content of the electric signal in the frequency range, a first comparator having a first input and a second input coupled to the output of the first unit and the output of the second unit, respectively, for comparing the value for the first quantity, corresponding to the frequency range and derived in the first unit, with the first value of the contents of the memory of the second unit which corresponds to said frequency range, the first comparator having a first output and a second output for supplying an output signal if the value of the quantity determined in the first unit lies within and outside, respectively, a range of values around the value stored in the memory of the second unit;

a third unit including a counter corresponding to the frequency range;

a second comparator having a first input coupled to an output of the third unit and an input for accepting a first final value, the second comparator being adapted to compare the count of the counter with the first final value;

wherein the first output and the second output of the first comparator are coupled to an input of the counter and a second input, respectively, of the third unit; and wherein the second comparator further having an output coupled to the second input of the third unit and to a control input of the conversion means for supplying a control signal thereto, if it is found in the second comparator that the count of the counter in the third unit has reached the first final value.

12. A device as claimed is claim 11, wherein the first unit is adapted to derive for a frequency range i, from the portion of the electric signal which lies within the time interval, the quantity representative of a measure of the energy content of said portion in the relevant frequency range; and wherein the second unit comprises:

n memories each corresponding to a respective one of the n frequency ranges, each of the n memories storing a value representative of a measure of the energy content of the electric signal in the associated frequency range; and wherein the first comparator is adapted to compare the value for the quantity corresponding to the $i^{th}$ frequency range and derived in the first unit with the value of the contents of the memory of the second unit corresponding to this frequency range; and wherein the third unit comprises:

n counters each corresponding to a respective one of the n frequency ranges; the second comparator being adapted to compare the count in the $i^{th}$ counter with the first final value; the first comparator being further adapted to supply respective output signals if the value of the quantity determined in the first unit and corresponding to the $i^{th}$ frequency range is not equaled to a range of values around the value stores in the $i^{th}$ memory of the second unit; and the second comparator being further adapted to supply a control signal if it is found in the second comparator that the count of the $i^{th}$ counter in the third unit has reached the first final value.

13. A device as claimed in claim 12, wherein the second output of the first comparator is coupled to a load input of the second unit for storing the value appearing on the input of he second unit, the second input value having been derived from the value for the $i^{th}$ quantity appearing on the output of the first unit and the value of the contents of the $i^{th}$ memory of the second unit, in the $i^{th}$ memory of the second unit, if it is found in the first comparator that the value for the $i^{th}$ quantity lies outside the range of values around the value already stored in the $i^{th}$ memory of the second unit.

14. A device as claimed in claim 12, further comprising:
a signal combination unit having a first input and a second input coupled to the output of the first unit and the output of the second unit, respectively, the combination further having an output coupled to the input of the second unit, the signal combination unit being adapted to derive a signal from the signals on its two inputs and to produce the resulting signal on its output; and wherein the second unit comprises:
a load input for receiving a control signal for storing the signal appearing on the input of the second unit in the associated memory i of the second unit.

15. A device as claimed in claim 11, further comprising:
an address counter having an output coupled to respective address inputs of the first, the second and the third unit; and
a clock pulse input coupled to an output of a clock pulse generator.

16. A device as claimed in claim 11, wherein the first unit for determining the quantity representative of a measure of the energy content in a specified frequency range i comprises:
a band-pass filter having a bandwidth corresponding at least substantially to the bandwidth of the frequency range, the bandpass filter having an input coupled to the input of the first unit and an output coupled to a first averager.

17. A device as claimed on claim 16, wherein the correction means comprises:
a second band-pass filter, a second averager and a signal combination unit for reducing at least substantially the influence of the signal amplified by the amplifier on the control signal, an input and an output of the second band-pass filter being coupled to the input of the amplifier and an input of the second averager, respectively, an output of the second averager being coupled to a first input of the signal combination unit, and a second input of the signal combination unit being coupled to an output of the first averager of the first unit.

18. A device as claimed in claim 16, wherein the correction means comprises a filter having a central frequency and a bandwidth adjustable to the central frequencies and the bandwidths of the n frequency ranges.

19. A device as claimed in claim 11, further comprising:
a second controllable amplifier arranged between the second input terminal of the device and the input of the first unit.

20. A device as claimed in claim 11, wherein the n frequency ranges have been selected so that they all have only a part of the frequency range of speech in common with said frequency range and wherein the combined n frequency ranges cover a frequency range within which most of the background noise is situated.

21. A device as claimed in claim 11, wherein the conversion means comprises:
a fourth unit including first n memories, each corresponding to a respective one of the n frequency ranges, for storing n reference values each corresponding to the respective one of the n frequency ranges;
a fifth unit including second n memories each corresponding to a respective one of the n frequency ranges;
a sixth unit having a first input and a second input coupled to an output of the fourth unit and to an output of the fifth unit, respectively, the sixth unit having an output coupled to the output of the conversion means, the sixth unit being adapted to derive a control signal from the signals applied to its two inputs;
wherein the control input of the conversion means is coupled to a load input of the fifth unit for storing the new value for the $i^{th}$ quantity in the corresponding memory of the fifth unit if it is found in the second comparator that the count of the $i^{th}$ counter in the third unit has reached the first final value.

22. A device as claimed in claim 21, further comprising:
an address counter, the output of the address counter being coupled to an address input of the fourth unit and the fifth unit.

23. A device as claimed in claim 21, wherein the sixth unit is adapted to derive n control signals for adjusting the gain of the amplifier in the n frequency ranges.

24. A device as claimed in claim 21, further comprising:
a seventh unit being arranged between the output of the conversion means and the control input of the amplifier, the seventh unit being capable of storing the value of the control signal derived in the sixth unit and including a load input for receiving a control signal at least once during an operation if during this operation it is found that for at least one frequency range i the count of the counter of the third unit has reached the first final value.

25. A device as claimed in claim 24, wherein the seventh unit is adapted to store n values corresponding to the n controls signals for controlling the gain of the amplifier; and wherein the seventh unit further comprises an address input coupled to the output of the address counter.

26. A device as claimed in claim 11 further comprising: an address counter; and wherein at least the second unit, the third unit, the first comparator, the second comparator, the conversion means, and the address counter form part of a microprocessor.

* * * * *